(12) United States Patent
Mochida

(10) Patent No.: US 6,507,917 B1
(45) Date of Patent: Jan. 14, 2003

(54) DATA MEMORY

(75) Inventor: Yoshifumi Mochida, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/444,553

(22) Filed: Nov. 22, 1999

(30) Foreign Application Priority Data

Nov. 26, 1998 (JP) .......................................... 10-335837

(51) Int. Cl.[7] .............................................. G06F 11/00
(52) U.S. Cl. ........................................ 714/5; 365/201
(58) Field of Search .............................. 714/5, 6, 8, 25, 714/32, 39, 42, 41; 365/201, 200; 711/133, 159

(56) References Cited

U.S. PATENT DOCUMENTS

| | | | | |
|---|---|---|---|---|
| 5,343,429 A | * | 8/1994 | Nakayama et al. | 365/200 |
| 5,353,253 A | * | 10/1994 | Nakajima | 365/200 |
| 5,416,740 A | * | 5/1995 | Fujita et al. | 365/200 |
| 5,625,596 A | * | 4/1997 | Uchida | 365/200 |
| 5,859,804 A | * | 1/1999 | Hedberg et al. | 365/201 |
| 5,875,194 A | * | 2/1999 | Nasu | 371/10.2 |
| 5,983,358 A | * | 11/1999 | Horiguchi et al. | 714/6 |
| 5,983,367 A | * | 11/1999 | Higuchi et al. | 714/42 |

FOREIGN PATENT DOCUMENTS

JP       2000-149590       5/2000

OTHER PUBLICATIONS

Copy of Office Action from Japanese Patent Office for Counterpart Japanese Patent Application Translation of Japanese Examiner's Comments for above Japanese Office Action as concise explanation of relevance.

* cited by examiner

Primary Examiner—Nadeem Iqbal
(74) Attorney, Agent, or Firm—Darryl G. Walker

(57) ABSTRACT

A data memory (100) can transfer a redundancy signal from a plurality of redundancy circuits (106-a to 106-f) to a decision and output circuit (124) in a roll call operation. Redundancy circuits (106-a to 106-f) can be successively connected to the decision and output circuit (124) by logic circuits (126-1 to 126-4) arranged in series. A redundancy signal from a redundancy circuit (106-a to 106-f) can be transferred to the decision and output circuit (124) through the logic circuits (126-1 to 126-4). Each logic circuit (126-1 to 126-4) can include an active device that buffers a received redundancy signal to a predetermined potential. Such an arrangement allows a redundancy signal to be input to the decision and output circuit (124) at the predetermined potential, regardless of the distance between a redundancy circuit (106-a to 106-f) and the decision and output circuit (124).

20 Claims, 7 Drawing Sheets

DATA MEMORY

TECHNICAL FIELD

The present invention relates generally to a data memory, and more particularly to a data memory with a RAM or ROM that includes a redundancy circuit.

BACKGROUND OF THE INVENTION

Data memories, such as those that can include a random access memory (RAM) or read only memory (ROM) are currently prevalent in many types of electronic devices. Increasingly, it is desirable to increase the capacity and/or degree of integration in such data memories.

While data memories continue to increase in size, it can be difficult to fabricate high capacity, high integration data memories that are always defect free. In order to increase the manufacturing yield of data memories, data memories typically include one or more spare memory cells.

Data memories can often be fabricated as integrated circuits in a substrate material, such as a semiconductor. As just one example, a data memory may be one of many "dies" in a "wafer." A die may be subsequently "packaged." Data memories are typically tested, prior to packaging, for defective memory cells. In the event a defective memory cell is detected, the defective memory cell may be replaced by a spare memory cell. As just one example, address data of the defective memory cell can be set to the address data of a spare memory cell. In this way, if a data memory has one or more defective memory cells, it can still be used by replacing such defective memory cells with spare memory cells.

One way in which spare memory cells can replace defective memory cells is through a programmable circuit that can include fusible links or the like. A laser may open selected fusible links to thereby redirect a defective memory cell address to a spare memory cell. In other words, a laser can "set" address data for a defective memory cell.

As noted above, a data memory in die form is typically packaged. One of the many types of packages is an epoxy resin package. Once placed in an epoxy resin package, it is usually no longer possible to observe the programmed redundancy information.

While data memories can be tested prior to packaging, sometimes data memories may fail after packaging. Such failures can be the result of defects that take longer to fail or may be caused by defective operation. Because packaging can completely cover a semiconductor memory die, it can be difficult to determine if an address has been set for a defective memory cell. Thus, if a failure occurs in a semiconductor memory after packaging, one cannot determine if the failure has occurred in a previously normal memory cell, in a spare memory cell that has replaced a defective memory cell, or in the redundancy circuit, including fusible links, if present.

One way to determine if an access is to a normal memory cell or a spare memory is to utilize a "roll call" circuit. One particular type of roll call circuit can provide a predetermined output when an address results in the activation of a redundancy circuit (such as one that may include fusible links). A predetermined roll call output can be provided externally to the data memory package. Thus, it can be possible to determine if a data memory access is to a normal memory cell or a spare memory cell.

A first example of a conventional data memory will now be described in conjunction with FIGS. 5 and 6. FIG. 5 is a schematic top view illustrating the internal layout of a data memory in the form of a memory "chip". FIG. 6 is a block diagram of a conventional redundancy circuit and result output circuit.

Referring now to FIG. 5 a memory chip is designated by the general reference character 500, and is shown to include memory circuits 502. In the particular example of FIG. 5, there are four memory circuits 502 formed in a body substrate 504. The memory circuits 502 and body substrate 504 can have a rectangular shape. The four memory circuits 502 are arranged into two rows and two columns.

Memory circuits 502 can include a number of normal memory cells, at least one spare memory cell, and a row/column decoder (all not illustrated). Normal memory cells may be accessed according to predetermined address data. A spare memory cell is normally not used. A row/column decoder can decode address data to select a particular memory cell or cells.

The memory chip 500 may also include a number of external connection terminals connected to address input circuits (not illustrated). Address data can be applied to the memory chip 500 by way of such external connection terminals.

When address data is input to the memory chip 500, such address data can be decoded by row/column decoders and one or more normal memory cells can be accessed. In the case of a write operation, write data on external connection terminals can be written into the accessed normal memory cells. In the case of a read operation, read data can be provided on external connection terminals.

In a "normal" access, address data can access normal memory cells in the memory circuits 502. However, the memory chip 500 can be set so that particular address data accesses one or more spare memory cells. In particular, prior to any testing, no spare memory cells can be accessed by an address. However, if the memory chip is inspected and a defective normal memory cell is detected, the memory chip 500 can be set so that the address of the defective normal memory cell accesses a spare memory cell.

In the example of FIG. 5, the memory chip 500 is shown to further include six redundancy circuits 506-a to 506-f situated between the memory circuits 502. Redundancy circuits 506-a to 506-d can be row redundancy circuits. One row redundancy circuit (506-a to 506-d) can be connected to each memory circuit 502. Redundancy circuits 506-e to 506-f can be column redundancy circuits. One column redundancy circuit (506-e to 506-f) can be connected to two memory circuits 502.

Redundancy circuits (506-a to 506-f) can include fuse include fusible links and an address comparison circuit, or the like. A fuse circuit can thus provide address changing functions and signal generating functions. A fuse circuit may particularly include a fuse ROM. Address data within the fuse ROM may be set by laser cutting to the address of a defective normal memory cell.

An address comparison circuit can compare address data received by external connection terminals. When the received address data corresponds to an address programmed into a fuse ROM, the access destination is changed from a normal memory cell to a spare memory cell. In addition, an address comparison circuit can further output a redundancy signal that indicates a spare memory cell access has taken place. Such a redundancy signal may be provided on one or more external connection terminals as a roll call signal.

A memory chip 500 can also include a result decision circuit 508 and result output circuit 510. The result decision circuit 508 and result output circuit 510 can include logic OR gates. The result decision circuit 508 is situated centrally with respect to the memory circuits 502 and redundancy circuits (506-a to 506-f) to minimize connection wiring 512 to the redundancy circuits (506-a to 506-f).

FIG. 6 shows how six redundancy circuits (506-a to 506-f) can be connected to a result decision circuit 508 and result output circuit 510.

In the examples of FIGS. 5 and 6, six redundancy circuits (506-a to 506-f) can be connected to one result decision circuit 508 by six signal wirings 512. The result decision circuit 508 can be connected to result output circuit 510 by signal wiring 514.

When defect analysis is performed on a packaged memory chip 500 an address can be applied to access a memory cell. The result decision circuit 508 can determine if the access is to a normal memory cell or a spare memory cell. This determination can be provided to the result output circuit 510. The result output circuit 510 can provide the determination on one or more external connection terminals. Such a determination can be a "roll call" signal.

The above described circuits (502, 506-a to 506-f, 508 and 510) and wirings (512 and 514) can be formed by various film layers formed on the body substrate 504. Such circuits and wirings, as well as other portions of the memory chip 500, can be sealed in an epoxy resin when the memory chip 500 is packaged. External connection terminals can have ends that extend out of the epoxy resin package.

A memory chip 500 such as that shown in FIG. 5 may execute data write operations and data read operations that access memory circuits 502. If the memory access is to a defective memory cell, a data write or data read operation can access a spare memory cell.

In a normal access, address data can be received on particular external connection terminals. The address information can then be decoded by row/column decoders in the memory circuits 502. A corresponding normal memory cell can then be accessed.

In a redundancy access, address data can be compared with address data set in a fuse ROM of the redundancy circuits. Such a comparison can occur prior to decoding by the row/column decoders of the memory circuits 502. When the received address data and programmed fuse ROM address correspond with one another, a spare memory cell, and not a normal memory cell, is accessed.

Therefore, in the memory chip 500 of FIG. 5, even if some of the normal memory cells are defective, the entire memory chip 500 does not have to be discarded because such defective normal memory cells can be replaced by spare memory cells. In this way the overall yield of such memory chips 500 can be increased.

As noted above, defects can be detected and address data can be set within redundancy circuits (506-a to 506-f) prior to a memory chip 50 being packaged. However, defects may still be detected after the memory chip 500 is packaged.

In the case of defects in packaged devices, it can be desirable to analyze the failure. For example, it can be desirable to determine if a defect in a normal memory cell was not detected or arose after inspection. It can also be desirable to determine if a spare memory cell used to replace a defective normal memory cell is itself, defective. Such information may help to improve the yield of subsequently manufactured memory chips.

To provide such failure information, without destructively opening a packaged device, a roll call function can be performed on a completed memory chip 500. One example of a roll call function can include performing a memory access with address data while monitoring a roll call signal. The roll call signal will be activated when an address accesses a redundancy circuit (506-a to 506-f).

Thus, when an address corresponds to a replaced normal memory cell, one of the redundancy circuits (506-a to 506-f) can output an active redundancy signal (low for example). The active redundancy signal indicates access to a spare memory cell. A result decision circuit 508 can detect an active redundancy signal and provide this information to the result output circuit 510, which can provide the information as output roll call data.

Therefore, the arrangement of FIGS. 5 and 6 can make it possible to determine for each address, whether the address accesses a normal memory cell or a spare memory cell within a memory circuit 502. Further, when a defect occurs in a packaged memory chip, it can be possible to determine if the defect occurs in an access to a normal memory cell or a spare memory cell.

In the circuit of FIG. 6, the result decision circuit 508 can include a NAND gate. A NAND gate is essentially the equivalent of a "negative" logic OR gate. That is, when an address corresponds to a replaced normal memory cell, a redundancy circuit (506-a to 506-f) is accessed. As a result, one of the redundancy signals RED1 to RED6 can transition from an inactive level to an active level (high to low, for example). The NAND gate can output an active internal roll call signal (high, in this case).

The internal roll call signal can be received by a result output circuit 510. The result output circuit 510 can activate (drive high in this case) an external roll call signal on an external connection terminal.

In memory chip 500, a single external connection terminal can be included for providing an external roll call signal, because all the redundancy circuits (506-a to 506-f) can be connected to a single result decision circuit 508 (which can include OR-like gates arranged in common). However, in such an arrangement, a number of signal wirings 512 are connected to a centrally located result decision circuit 508. Such a wiring arrangement, and position of a result decision circuit 508, can require a predetermined amount of area and/or introduce line routing constraints into the wiring patterns of the memory chip 500. Such area and routing constraints can make it difficult to reduce the size of the memory chip 500. One skilled in the art would recognize that it is desirable to "shrink" memory chips as new technology allows for the fabrication of smaller features and devices. A smaller memory chip 500 can be less expensive to produce and/or operate faster and/or consume less power and/or operate at a lower voltage.

Another conventional approach for addressing the above-mentioned wiring constraints is shown in FIG. 7. FIG. 7 is a schematic top view illustrating the internal layout of a data memory in the form of a memory chip. The memory chip is designated by the general reference character 700, and can include some of the same, or similar, general constituents as the memory chip of FIG. 5. To that extent, like constituents will be referred to by the same reference character, but with the first reference number being a "7" instead of a "5."

In the second conventional memory chip 700, a result decision circuit (such as 508) and a decision output circuit (such as 510) can be integrated to form a decision and output circuit 716. A decision and output circuit 716 may be situated on the outer margin of the memory chip 700. Redundancy circuits 706-a to 706-f can be connected to the decision and output circuit 716 by signal wiring 718.

The memory chip 700 arrangement of FIG. 7 does not have to include a centrally situated result decision circuit. Further, by using a decision and output circuit 716, the memory chip 700 does not have to include a wiring between a result decision circuit and a decision output circuit. However, the memory chip 700 does include signal wirings 718. Such wirings 718 can introduce the area and routing constraints mentioned in conjunction with FIG. 5.

The official gazette of Japanese Patent Laid-Open No. 47196/1993 discloses a data memory that can address the drawbacks of the embodiment of FIG. 7. The above-mentioned laid-open publication shows a data memory having redundancy circuits that are connected to a decision and output circuit by a single wiring.

Referring now to FIGS. 8–10, the above-mentioned data memory is illustrated as a third conventional example. FIG. 8 is a schematic top view illustrating the internal layout of a data memory in the form of a memory chip 800. FIG. 9 is a block diagram illustrating redundancy circuits and a decision and output circuit. FIG. 10 is a timing diagram illustrating various signals that may be used in the circuits of FIG. 9.

The memory chip 800 can include some of the same, or similar, general constituents as the memory chip of FIG. 7. To that extent, like constituents will be referred to by the same reference character, but with the first reference number being an "8" instead of a "7."

The memory chip 800 has a single signal wiring 820 connected to one decision and output circuit 816. The decision and output circuit 816 is situated at the outer margin of the memory chip 800. A number of redundancy circuits 806-a to 806-f can be connected to the single signal wiring 820 by a number of branch wirings 822-a to 822-f.

Referring now to FIG. 9, redundancy circuits 900-a to 900-f can include a p-type transistor 902. A p-type transistor can be a metal-oxide-semiconductor field effect transistor (MOSFET). In FIG. 9, p-type channel transistors are distinguished from n-type transistors by presence or absence of a "circle." Each p-type transistor 902 may include an input terminal 904 that can receive a redundancy signal RED1 to RED6.

Each p-type transistor 902 can include a gate coupled to an input terminal 904, a source coupled to a power supply node 906, and a drain coupled to a signal wiring 908.

As also shown in FIG. 9, a decision and output circuit 910 can include a result decision circuit 912 in series with result output circuit 914. A roll call signal from the result decision circuit 912 can be output by result output circuit 914 on an external connection. In the particular arrangement of FIG. 9, the result decision circuit 912 can receive an output permit signal ROLLEN, and the result output circuit 914 can buffer a roll call signal from the result decision circuit 912.

The particular example of a result decision circuit 912 set forth in FIG. 9 can include a p-type transistor 916 and an n-type transistor 918. The output permit signal ROLLEN, which can also be conceptualized as a "roll call entry signal," can be received on an external roll call terminal 920. The external roll call terminal 920 can be coupled to the gates of transistors 916 and 918.

The source and drain of p-type transistor 916 can be connected to a power supply node 906 and signal wiring 908, respectively. The source and drain of n-type transistor 918 can be connected to a ground node 922 and signal wiring 908, respectively. N-type transistor 918 can function as a "pull-down" device in a "wired-OR" circuit.

It is noted that in the particular arrangement of FIG. 9, even if a p-type transistor 902 is turned on at the same time the n-type transistor 918 is turned on, the output of the result decision circuit 912 can be high. Thus, in one arrangement, the transistor channel widths of p-type transistors 902 can be larger than the transistor channel width of n-type transistor 918.

The structures illustrated by FIGS. 8 and 9 can include one signal wiring (820 or 908) connected to a single decision and output circuit (816 or 910), and to branch wirings (822-a to 822-f) that function as portions of a wired-OR type circuit.

In the particular example of FIG. 9, in a "normal" mode, the roll call entry signal ROLLEN can be maintained at an inactive level (low, in this case). P-type transistor 916 can be turned on and n-type transistor 918 can be turned off. Thus, the potential of the single signal wiring 908, shown as REDOR, can be maintained at an inactive level (high, in case).

However, when a roll call operation is executed, the roll call entry signal ROLLEN is activated (driven high in this case). P-type transistor 916 can be turned off and n-type transistor 918 can be turned on. With n-type transistor 918 turned on, signal wiring 908 can be initially connected to a ground potential.

In a roll call operation, address information can be applied to a memory chip 800. If an applied address accesses a normal memory cell, redundancy signals RED1 to RED6 will be inactive (high, in this case). The p-type transistors 902 will remain off, and signal wiring 908 can remain at the ground potential.

However, if address information in a roll call operation accesses a spare memory cell, one of the redundancy signals RED1 to RED6 can be activated (driven low, in this case). One of the p-type transistors 902 can be turned on. The turned on p-type transistor 902 can have greater current driving capacity than n-type transistor 918, and signal wiring 908 can be driven to a high potential. The high potential can be detected by the decision and output circuit 910.

The conventional approaches illustrated in FIGS. 8 and 9 can include one signal wiring (820 or 908) that is spread across a memory chip 800. Further, because branch wirings (822-a to 822-f) are not necessarily parallel to the signal wiring, it can be possible to reduce the size of the memory chip 800 over other approaches. Still further, because a number of redundancy circuits (806-a to 806-f) are connected to a signal wiring (820 or 908) in a wired-OR arrangement, the resulting structure can be simpler than other conventional approaches. Such simplicity can make manufacturing and/or design easier.

It is noted that in the arrangement of FIG. 9, the potential of signal wiring 908 REDOR can be given by the relationship shown below.

$$\frac{V_{CC} \times R_{ONN}}{R + R_{ONN} + R_{ONP}}$$

In the above relationship Vcc can be a power supply voltage, "$R_{ONN}$" can be the "on" resistance of n-type transistor 918, "R" can be the wiring resistance of signal wiring 908, and "$R_{ONP}$" can be the on resistance of a p-type transistor 902.

The wiring resistance R can be a resistance value between an activated redundancy circuit 900-a to 900-f and the result decision circuit 912. In FIG. 9, the inherent resistance of signal wiring 908 is shown in portions as R1, R2, R3 . . . to R6. Thus, if redundancy circuit 900-b is activated, the wiring resistance would be R2+R3+R4+R5+R6. If redundancy circuit 900-f is activated, the wiring resistance would be R6.

Thus, in the circuit of FIG. 9, the wiring resistance R of signal wiring 908 can vary according to which redundancy circuit 900-*a* to 900-*f* is activated. Accordingly, when a redundancy circuit is situated at a relatively far distance from a result decision circuit 912, the wiring resistance R is higher, and the resulting signal wiring 908 potential REDOR is lower.

A drawback to the arrangement of FIG. 9 is that if a redundancy circuit (900-*a* to 900-*f*) is activated, the signal wiring 908 potential REDOR should ideally rise to a predetermined potential. The result output circuit 914 could detect this rise, and provide a high output signal. However, due to wiring resistance R, the REDOR potential may not rise to a sufficiently high potential, and the result output circuit 914 can erroneously output a low output value.

This drawback may be better understood by an example. The result output circuit 914 can be considered a "level" detect circuit. If it assumed the level detect circuit has a threshold of 0.5 Vcc, the resulting wiring resistance R of signal wiring 908 should meet the condition $R<(R_{ONN-RONP})$.

Thus, in the arrangement of FIGS. 8 and 9, it may be necessary to ensure a smaller resistance for the signal wiring 908. Resistance can be reduced by moving a result decision circuit 912 closer to the redundancy circuits (900-*a* to 900-*f*). In addition, or alternatively, the width of signal wiring 908 can be increased. While such approaches can reduce the possibility of an erroneous result output circuit 914 output, such approaches can introduce layout constraints into a memory chip.

FIG. 10 shows four waveforms, including the roll call entry signal ROLLEN, one redundancy signal RED4, another redundancy signal RED1, and the resulting potential of a signal wiring REDOR. At time t0, the result decision circuit 912 can be enabled. This can force the REDOR potential low.

At time t1, the redundancy signal RED4 is activated, causing the REDOR potential to be driven high. Because the redundancy circuit 900-*d* that receives the RED4 signal is closer to the result decision circuit 912, the wiring resistance R is relatively small, and the REDOR can rise to a relatively high potential. The RED4 can return high, resulting in the REDOR signal being driven low again.

At time t2, the redundancy signal RED1 is activated, causing the REDOR potential to be driven high again. Because the redundancy circuit 900-*a* that receives the RED1 signal is further from the result decision circuit 912, the wiring resistance R is relatively high, and the REDOR can rise to a lower potential than the RED4 case.

One way to address the wiring resistance problem described above is shown in FIG. 11. FIG. 11 is a fourth example of a conventional data memory in the form of redundancy circuits and a decision and output circuit. FIG. 12 is a timing diagram illustrating the operation of the circuits in FIG. 11.

FIG. 11 includes many of the same, or similar, general constituents as FIG. 9. To that extent, like constituents will be referred to by the same reference character, but with the first reference number being an "11" instead of a "10."

The arrangement of FIG. 11 includes a roll call decision circuit 1124 that includes a p-type transistor 1116 and an n-type transistor 1118. The roll call decision circuit 1124 can receive a one-shot signal ROLLC at an external one-shot terminal 1126 in addition to a roll call entry signal ROLLEN at an external roll call terminal 1120. The one-shot signal ROLLC is applied to the gate of n-type transistor 1118, while the roll call entry signal ROLLEN can be applied to the gate of p-type transistor 1116.

In a "normal" mode, a roll call entry signal ROLLEN can be inactive (low in this case) and the one-shot signal ROLLC can be inactive (maintained low in this example). P-type transistor 1116 can be turned on, and n-type transistor 1118 can be turned off. The signal wiring 1108 potential REDOR can thus be at a high potential. A normal mode is shown at time t0 in FIG. 12.

When a roll call operation is executed, the roll call entry signal ROLLEN is activated (driven high in this case). Further, the one-shot signal ROLLC can transition high and then return low. With the ROLLEN signal high, p-type transistor 1116 can be turned off. When the ROLLC signal pulses high, n-type transistor 1118 can turn on, pulling the REDOR potential to a low level. The REDOR potential may then change, depending upon whether a normal memory cell or a spare memory cell is accessed.

When a normal memory cell is accessed, the redundancy signals RED1 to RED6 can remain inactive (high). P-type transistors 1102 within the redundancy circuits (1100-*a* to 1100-*f*) will remain turned off. Because n-type transistor 1118 was initially turned on by the ROLLC signal, when the ROLLC signal returns low, the signal wiring 1108 potential REDOR will remain at a low level. An example of a roll call operation to a normal memory is shown to begin at time t3 in FIG. 12.

When a spare memory cell is accessed, one of the redundancy signals RED1 to RED6 can be activated (transition low) turning on a p-type transistor 1102 within one of the redundancy circuits (1100-*a* to 1100-*f*). Signal wiring 1108 can be connected to a power supply node 1106. While n-type transistor 1118 is initially turned on by the ROLLC signal, when the ROLLC signal returns low, n-type transistor 1118 can be turned off.

With n-type transistor 1118 turned off and a p-type transistor 1102 turned on, the potential of signal wiring 1108 can rise to a relatively high potential.

One skilled in the art would recognize that two roll call operations to spare memory cells are illustrated in FIG. 12. The first such operation begins at time t1 and represents the activation of a p-type transistor 1102 in response to the RED4 signal. Because the p-type transistor 1102 that is turned on is in relative close proximity to roll call decision circuit 1124, wiring resistance can be relatively small. The second such operation begins at time t2 and represents the activation of a p-type transistor 1102 in response to the RED1 signal. Because the p-type transistor 1102 that is turned on is relatively far from roll call decision circuit 1124, wiring resistance can be relatively high. However, because n-type transistor 1118 is turned off, the REDOR potential can rise to higher level than the conventional approach illustrated in FIG. 9.

Thus, in the arrangement illustrated in FIGS. 11 and 12, the signal wiring 1108 potential REDOR can be driven to a high level in accordance with redundancy signals RED1 to RED6 essentially independently of the channel width sizes of p-type transistors 1102 and n-type transistor 1118. This can make the output of the roll call decision circuit 1124 more accurate than other conventional wired-OR approaches.

Because the drawbacks introduced by wiring resistance can be addressed by the example of FIGS. 11 and 12, redundancy circuits (1100-*a* to 1100-*f*) can be situated at further distances from a roll call decision circuit 1124. In addition, or alternatively, the width of signal wiring 1108 does not have to be increased to reduce wiring resistance. As a consequence, a memory chip can have fewer layout restrictions.

The example of FIGS. 11 and 12 can have drawbacks however. In a roll call operation, signal wiring 1108 can float, and thus be susceptible to noise that can generate an erroneous signal. For example, in a roll call operation that accesses a spare memory cell, when a redundancy signal (such as RED1 to RED6) returns to an inactive state (high) while n-type transistor 1118 is turned off, signal wiring 1108 can float. This is shown in FIG. 12 by time period 1200. In addition, when a roll call operation accesses a normal memory cell, signal wiring 1108 can be floating while n-type transistor 1118 is turned off. This is shown in FIG. 12 by time period 1202.

Further, in order to inspect a data memory according to the above-described example, an inspection unit must include a control circuit dedicated to generating a one-shot signal that can be applied to an external one-shot terminal 1126. Further, the data memory would have to provide a dedicated external connection for the external one-shot terminal 1126. Such requirements can make inspection units complicated, and prevent the further reductions in the size of a data memory and/or an inspection unit.

It would be desirable to provide a data memory that can detect the operation of multiple redundancy circuits with a single signal wiring path, but not include the drawbacks of conventional approaches. In particular, it would be desirable to provide a data memory with a single signal wiring path that does not require a decision and output circuit that is situated relatively close to the redundancy circuits, and/or require a wide signal wiring for reduced wiring resistance, and/or a dedicated external input for the application of a one-shot signal, or the like.

SUMMARY OF THE INVENTION

A data memory according to one embodiment can include one or more memory circuits, a number of redundancy circuits, and a decision and output circuit. A memory circuit can include a plurality of normal memory cells that store data and can be accessed by predetermined addresses, at least one spare memory cell, and access circuits that can access normal memory cells according to address data. In particular embodiments, data can be stored in binary form. Further, according to various embodiments, data may be read and/or written and/or programmed and/or erased in the memory cells.

A redundancy circuit may include an address setting circuit, an access changing circuit, and a signal generating circuit. The address of a normal memory cell may be set within the address setting circuit to access a spare memory cell according to the set address. The access changing circuit can change the access destination from a normal memory cell to a spare memory cell when an externally applied address coincides with the address set in the address setting circuit. The signal generating circuit can activate a redundancy signal when the access changing circuit is activated.

A decision and output circuit can detect a redundancy signal and output it on an external connection terminal. The various signal generating circuits can be connected to the decision and output circuit by logic circuits arranged in series. Each logic circuit can include an active device that can buffer a redundancy signal to a predetermined potential. In one particular arrangement, logic circuits may have an OR-type function.

In the above-described embodiment, addresses can correspond to each normal memory cell in a memory circuit. Thus, upon receiving an externally applied address, access circuits can access corresponding normal memory cells. In one particular arrangement, data can then be read from or written into the accessed normal memory cell.

However, in the event one or more normal memory cells are defective, the addresses of a defective normal memory cell can be set within the address setting circuit of a redundancy circuit. Then, if an externally applied address coincides with an address set within a redundancy circuit, the access destination is changed from the defective normal memory cell to a spare memory cell. Thus, even if the data memory includes a defective normal memory cell, a memory access may still be performed, but to a spare memory cell. In this way it is not necessary to dispose of a whole data memory when only a few normal memory cells are defective.

As described above, signal generating circuits within the redundancy circuits can generate a redundancy signal when their respective access changing circuit is activated. Such a redundancy signal can be detected by a decision and output circuit and output on an external connection terminal. This can make it possible to determine if the access destination of an applied address is a normal memory cell or a spare memory cell during a data memory inspection. Because the signal generating circuits are successively connected to the decision and output circuit by a series of logic circuits, a redundancy signal generated by any of the redundancy circuits can be detected by the decision and output circuit.

However, because each logic circuit can include an active device, each such logic circuit can buffer a received redundancy signal to a predetermined potential. Therefore, redundancy signals that are input to the decision and output circuit can be of the predetermined potential, regardless of the distance between the decision and output circuit and the redundancy circuit that generates the redundancy signal.

According to another embodiment, a data memory can include redundancy circuits with signal generating circuits. The signal generating circuits can be successively connected to a decision and output circuit by logic circuits arranged in series. Each logic circuit can include output buffer circuits that can buffer a received redundancy signal to at least a predetermined potential. In one particular embodiment, logic circuits may be OR-type circuits.

In the above arrangement, a redundancy signal generated by a redundancy circuit can be transferred up to a decision and output circuit through logic circuits. The output circuit of each logic circuit can buffer the redundancy circuit to the predetermined potential. Thus, a buffered redundancy signal can be input to a decision and output circuit at the predetermined potential independent of the distance between the decision and output circuit and the redundancy circuit that generates the redundancy signal.

According to another embodiment, a data memory can include a number of redundancy circuits. The redundancy circuits can include signal generating circuits that are successively connected to a decision and output circuit by logic circuits arranged in series. Each logic circuit includes output circuits that can buffer a received redundancy signal to a predetermined potential. In one particular embodiment, logic circuits may be OR-type circuits.

In the above arrangement, a redundancy signal generated by a redundancy circuit can be transferred up to a decision and output circuit through logic circuits. The output circuit of each logic circuit can buffer the redundancy circuit to the predetermined potential. Thus, a buffered redundancy signal can be input to a decision and output circuit at the predetermined potential independent of the distance between the decision and output circuit and the redundancy circuit that generates the redundancy signal.

The logic circuits of the above-described data memory may further include input switching circuits. Input switching circuits can selectively switch input signals into a logic circuit. In such an arrangement, one or more redundancy signals can be switched into a logic circuit and applied to a decision and output circuit. In addition, non-redundancy signals can be switched into a logic circuit and applied to the decision and output circuit.

Further, input switching circuits can include an active element for buffering a selected input signal to at least a predetermined potential. In this case, because the selected signal is buffered to the predetermined potential, the input to the decision and output circuit can be at the predetermined potential.

In one particular variation of the above-described embodiment, logic circuits can provide an OR-type function, and include a NAND gate and an inverter. In such an arrangement, if the redundancy circuits and/or decision and output circuit are operated according to "negative" logic, such a redundancy signal can be provided to the decision and output circuit.

DETAILED DESCRIPTION OF THE EMBODIMENTS

Figure 1:
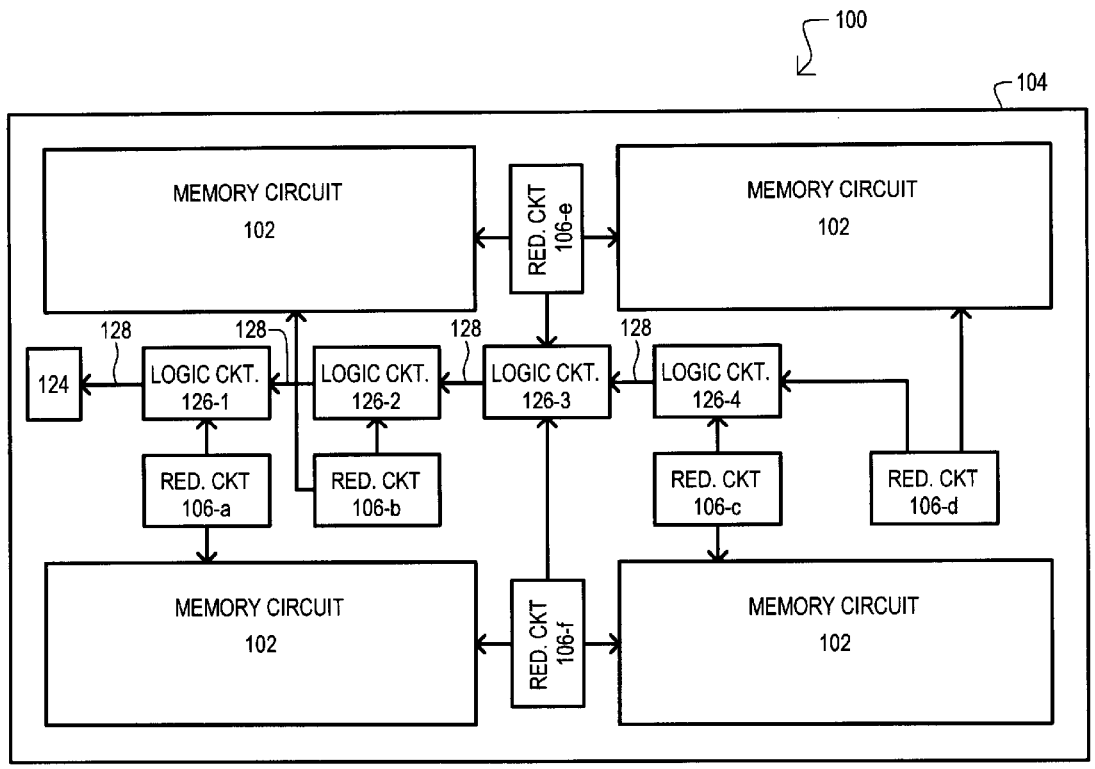
FIG. 1 shows a data memory according to one embodiment.

One embodiment of the present invention will now be described in conjunction with FIGS. 1 to 4. The described embodiment can include some, or similar constituents to the conventional example set forth in FIG. 8. To that extent, like constituents will be referred to by the same reference character, but with the first digit being a "1" instead of an "8."

Figure 3:
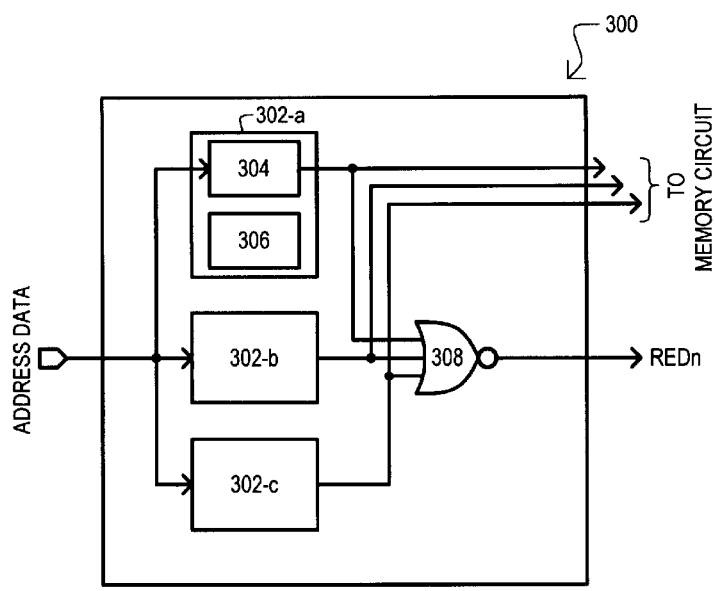
FIG. 3 is a block diagram of a redundancy circuit that may be used in an embodiment.
Figure 2:
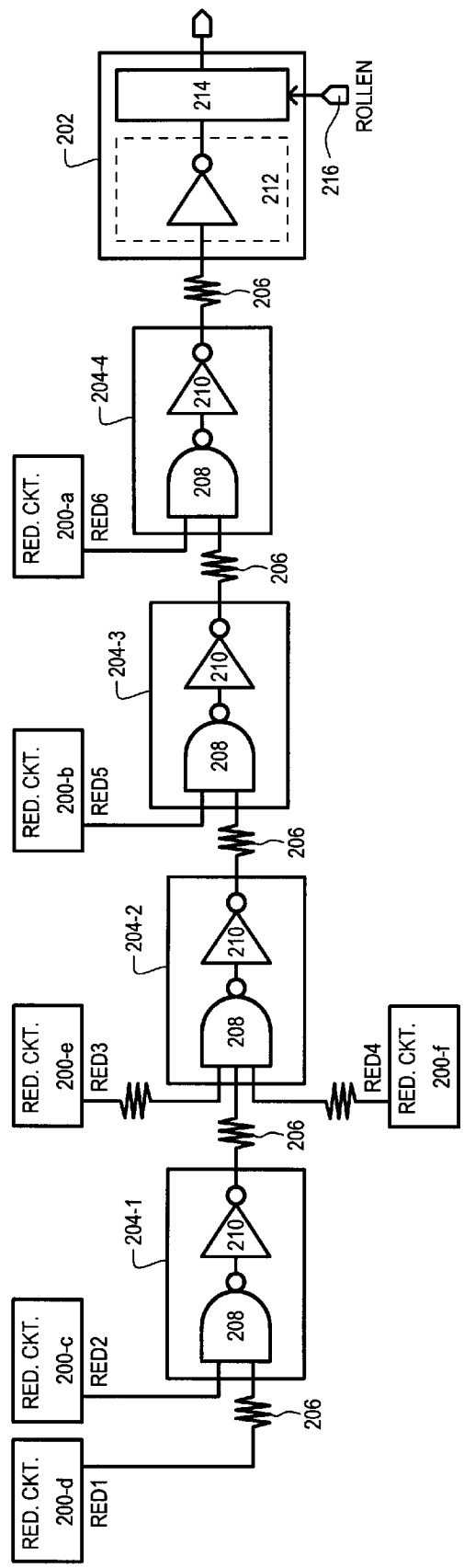
FIG. 2 is block diagram illustrating redundancy circuits, a decision and output circuit, and other circuits that may be used in the embodiment of FIG. 1.

FIG. 1 is a schematic top view illustrating the internal layout of a data memory in the form of a memory chip 100. FIG. 2 is block diagram illustrating redundancy circuits, a decision and output circuit, as well as other circuits according to one embodiment. FIG. 3 is a block diagram of a fuse circuit according to a particular embodiment.

Referring now to FIG. 1, a memory chip 100 according to one embodiment can include a number of memory circuits 102 formed in a body substrate 104. In the particular arrangement of FIG. 1, the memory chip 100 includes four memory circuits 102 arranged in two rows and two columns. Memory circuits 102 and a body substrate 104 can have rectangular shapes. A memory chip 100 may also include redundancy circuits (106-*a* to 106-*f*). The particular embodiment of FIG. 1 includes six redundancy circuits (106-*a* to 106-*f*).

A memory chip 100 may also include a decision and output circuit 124 that is situated on an outer margin of the memory chip 100.

Unlike conventional approaches, the embodiment of FIG. 1 can include redundancy circuits 106-*a* to 106-*f* that are connected to a single decision and output circuit 124 by a number of logic circuits 126-1 to 126-4 and output wirings 128.

Referring now to FIG. 2, one example of an arrangement of redundancy circuits, a decision and output circuit, logic circuits and output wirings are shown in a block diagram. Redundancy circuits are shown as items 200-*a* to 200-*f*. Decision and output circuit is shown as item 202. Logic circuits are shown as item 204-1 to 204-4, and output wirings are shown as items 206.

Logic circuits (204-1 to 204-4) may each include a NAND gate 208 and an inverter 210. A NAND gate 208 and/or inverter 210 can buffer received input signals. NAND gate 208 and inverter 210 can be supplied with power from a connection that is common to a closest redundancy circuit (200-*a* to 200-*f*).

It is noted that the NAND gate 208 in conjunction with inverter 210 can provide a "negative" OR type function. Accordingly, logic circuits (204-1 to 204-4) can be conceptualized as "OR" type circuits.

In the particular logic circuits (204-1 to 204-4) of FIG. 2, when an input redundancy signal (RED1 to RED6) of a logic circuit transitions low, the NAND gate 208 of the logic circuit can output a high logic level. This high value can be inverted by inverter 210 to provide a low logic level. In this way, input redundancy signals (RED1 to RED6) can be added to one another. When a low redundancy input signal (RED1 to RED6) is added with a high input redundancy signal (RED1 to RED6), the result can be a low signal. This result can be used to generate a roll call signal.

As noted above, each logic circuit (204-1 to 204-4) can have a power supply wiring connection that is common to a closely situated redundancy circuit (200-*a* to 200-*f*). In such an arrangement, as input redundancy signals (RED1 to RED6) are buffered and added, the output signal of a logic circuit situated remotely from decision and output circuit 202, such as 204-*d*, can have an output signal driven by a power supply node that is also remote with respect to decision and output circuit 202. However, such a remotely generated signal can be buffered by intervening logic circuits until it can be driven by a logic circuit (such as 204-*a*) having a power supply node that is situated relatively close to the decision and output circuit 202.

One example of redundancy circuit is shown in FIG. 3, designated by the general reference character 300. A redundancy circuit 300 may include a number of fuse circuits 302-*a* to 302-*c*. As shown by fuse circuit 302-*a*, each fuse circuit (302-*a* to 302-*c*) may include an address comparison circuit 304 and a fuse read only memory (ROM) 306. An address comparison circuit 304 can change the access of a data memory from an access to a normal memory cell to an access of a spare memory cell. A fuse ROM may be used to set the address of a defective normal memory cell. A redundancy circuit 300 may also include a NOR gate 308 that can generate a redundancy signal REDn.

In one particular arrangement, the address data corresponding to a defective normal memory cell can be set within a fuse ROM 306 by laser cutting or the like. The set address will thus designate access to a particular spare memory cell. Address information can then be applied to an address comparison circuit 304. Address comparison circuit 304 can compare the applied address information to the information set within its corresponding fuse ROM 306. If the address data does not coincide, address comparison circuit 304 can maintain an inactive (low in this case) output signal level. However, if the address data coincides, address comparison circuit 304 can provide an active output signal (high in this case).

As shown in FIG. 3, the outputs of the fuse circuits (302-a to 302-c) can be provided to a memory circuit (such as 102). Such an arrangement can enable an applied address to access a spare memory cell instead of a normal memory cell. Further, because the outputs of the fuse circuits (302-a to 302-c) are provided to NOR gate 308, in the event any of the outputs transitions high, the output of NOR gate 308 REDn will go low.

Referring back to FIG. 2, a decision and output circuit 202 can include a result decision circuit 212 and a result output circuit 214 arranged in series with one another. In one particular embodiment, the result decision circuit 212 can include an inverter, or the like, that can make the output of the decision circuit 212 have logic levels that correspond to conventional approaches.

The result output circuit 214 can receive the output of result decision circuit 212. In addition, the result output circuit 214 can receive a roll call entry signal ROLLEN from an external roll call terminal 216. When the roll call entry signal ROLLEN is active, the result output circuit 214 can provide a roll call signal.

In the particular example of FIGS. 1 and 2, six redundancy circuits may be arranged between two columns and two rows of memory circuits 102. Thus, a logic circuit 126-3 situated at the common corners of the memory circuits 102 can have three inputs. Redundancy circuits 106-e and 106-f and logic circuit 126-4 can be coupled to the three inputs of logic circuit 126-3 from three different directions.

In a data memory according the embodiment of FIG. 1, one of a number of redundancy circuits (106-a to 106-f) can activate a redundancy signal during a roll call operation. Such a redundancy signal can then be buffered through a series of logic circuits (126-1 to 126-4).

The embodiment of FIG. 1 can differ from the previously described conventional approaches in that each logic circuit (126-1 to 126-4) does not necessarily form a portion of a wired-OR type circuit, but instead can include active devices coupled to power supply nodes. Thus, a redundancy signal is buffered whenever it is logically combined (ORed in this case) in a logic circuit (126-1 to 126-4).

Thus, an arrangement such as that set forth in FIGS. 1 and/or 2 can include redundancy circuits (106-a to 106-f) that can activate a redundancy signal. The active redundancy signal can result in an input signal to a decision and output circuit 124. However, unlike conventional approaches, the potential of an input signal to the decision and output circuit 124 does not vary according to the distance between the activated redundancy circuit (106-a to 106-f) and the decision and output circuit 124. In this way, the described embodiments may more accurately detect redundancy signals.

A memory chip 100 may be reduced in area as it does not include a number of signal wirings arranged in parallel. One skilled in the art would recognize that signal routing may also be simplified by such an arrangement. Further, as noted above, such a memory chip 100 may accurately detect redundancy signals regardless of the distance between a redundancy circuit (106-a to 106-f) and a decision and output circuit 124. Still further, a single wiring does not have to have a certain width to assure a low enough resistance. Thus, the described embodiments illustrate a data memory that may accurately execute roll call operations with a relatively simple structure.

Figure 8:
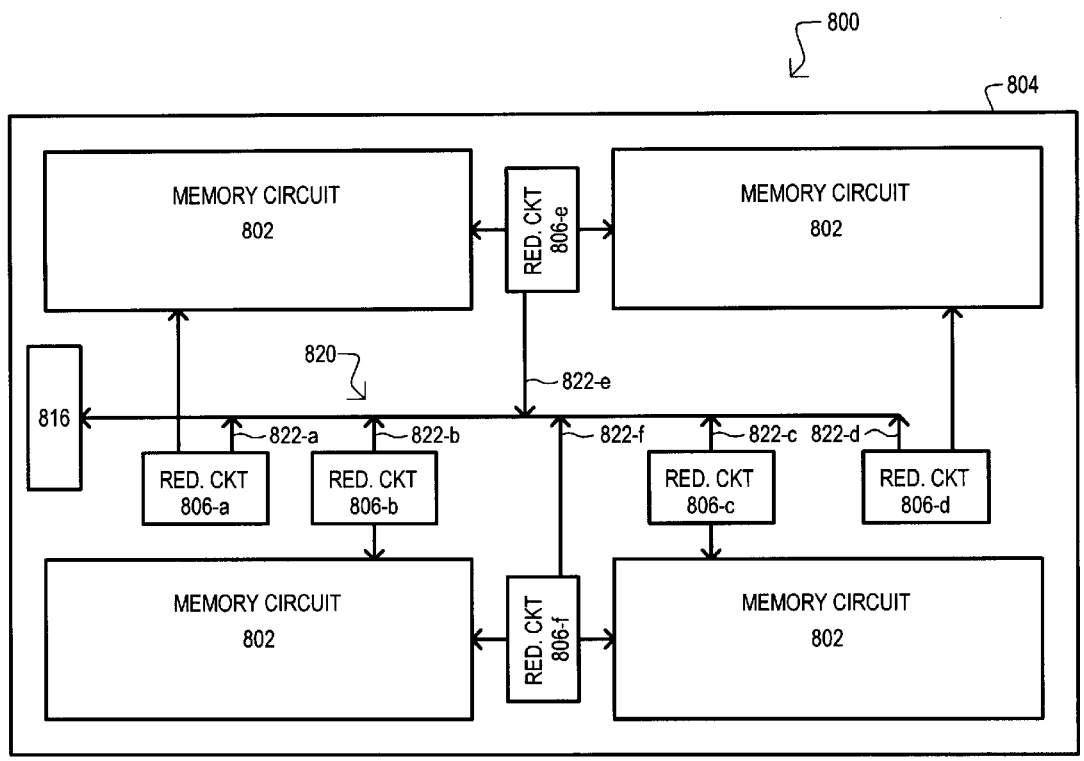
FIG. 8 is a third example of a conventional data memory.
Figure 9:
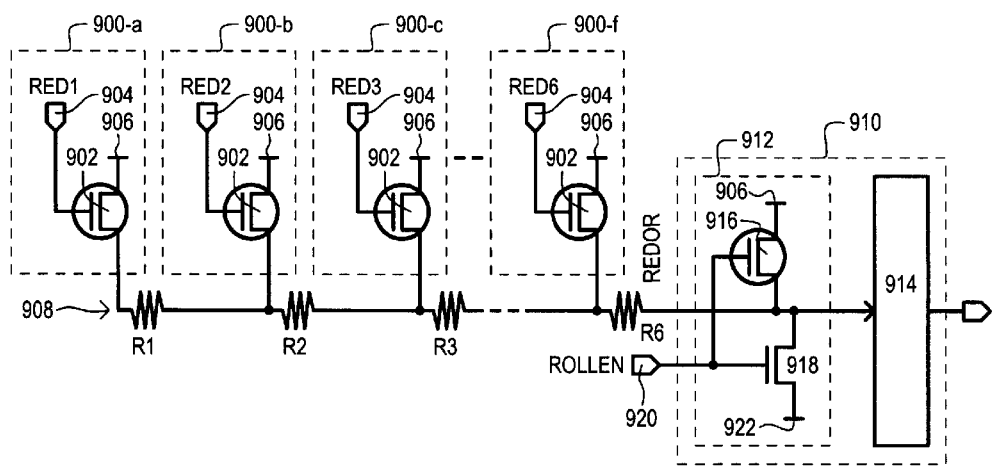
FIG. 9 is a block diagram of conventional redundancy circuits and a decision and output circuit.
Figure 10:
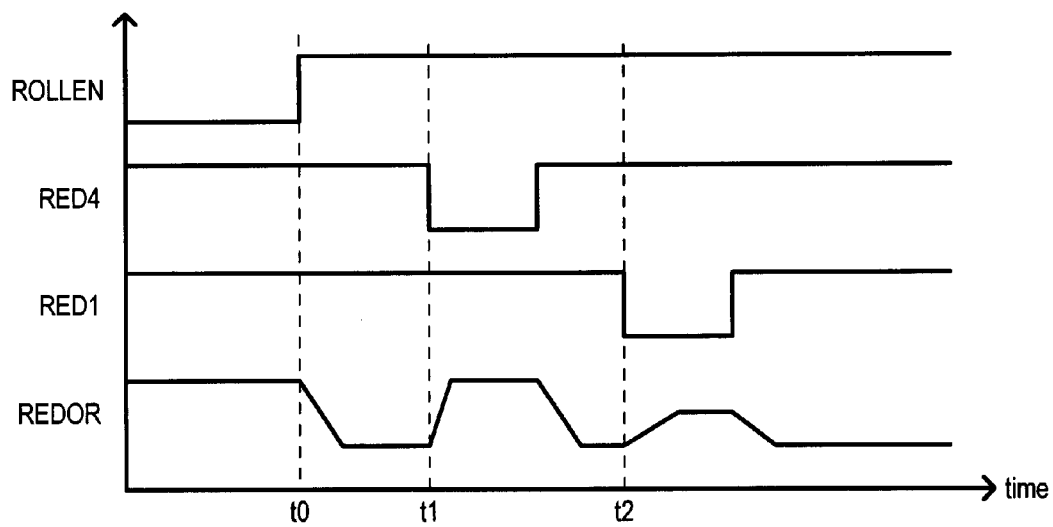
FIG. 10 is a timing diagram of signals that may be used in the circuits of FIG. 9.
Figure 11:
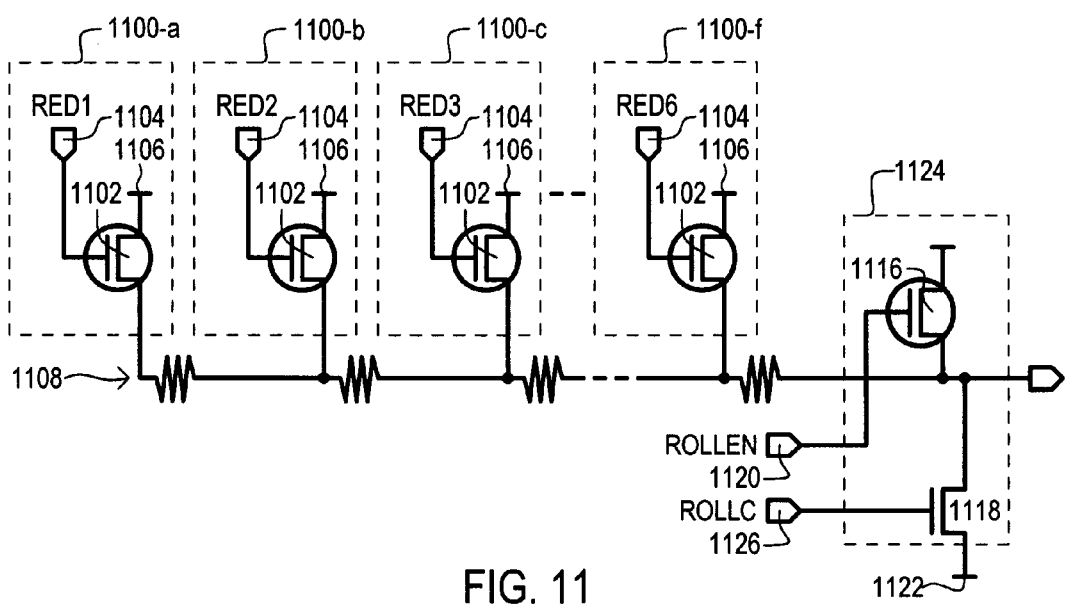
FIG. 11 is another block diagram of conventional redundancy circuits and a decision and output circuit.
Figure 12:
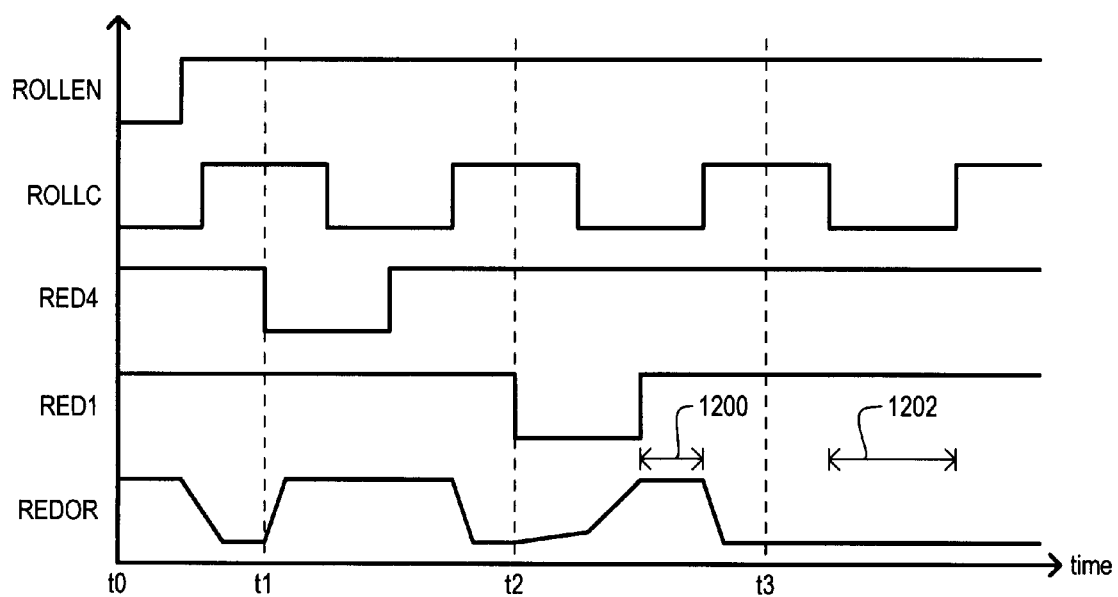
FIG. 12 is a timing diagram of signals that may be used in the circuits of FIG. 11.

It is noted that the described embodiments include logic circuits (126-1 to 126-4 and 204-1 to 204-4) that can include described embodiments may be greater than the conventional memory chip 800 of FIG. 8. However, such an increase in area is slight compared to approaches that lay multiple signal wirings in parallel.

It is understood that the described embodiments should not be construed as restricting the present invention thereto. Various modifications may occur without departing from the gist of the invention.

For example, the above described embodiments illustrate a case where redundancy signals (RED1 to RED6) generated by redundancy circuits (106-a to 106-f) are transmitted to a decision and output circuit (124 or 202) by a number of logic circuits (126-1 to 126-4 and 204-1 to 204-4) connected in series. However, the number of input signals to a logic circuit (126-1 to 126-4 and 204-1 to 204-4) may be increased. Further, the series of logic circuits (126-1 to 126-4 and 204-1 to 204-4) can buffer signals other than redundancy signals.

Figure 4:
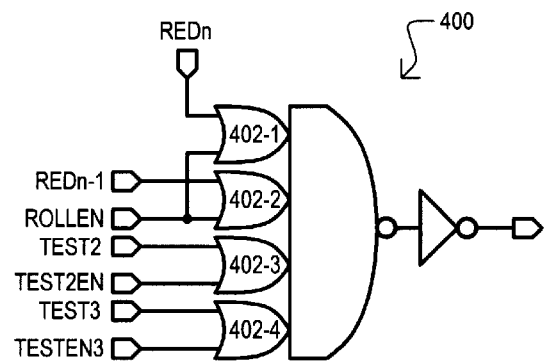
FIG. 4 is a block diagram of input switching according to one embodiment.
Figure 5:
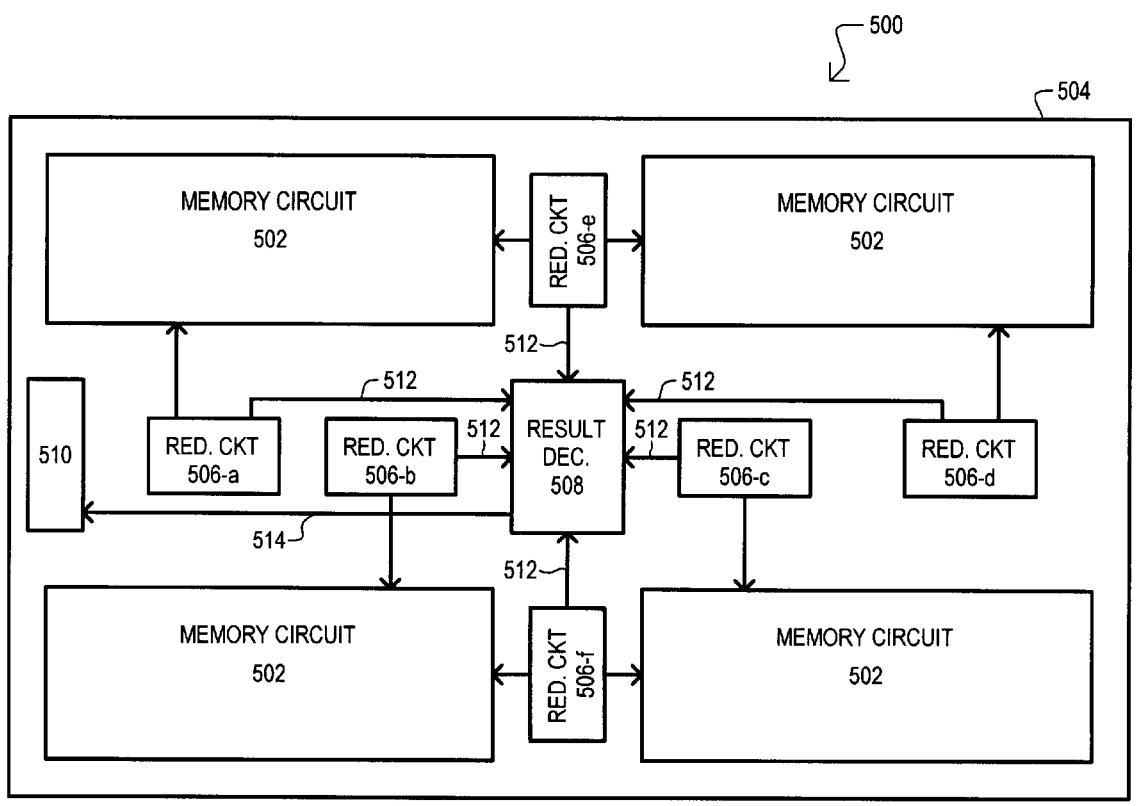
FIG. 5 shows a first example of a conventional data memory.
Figure 6:
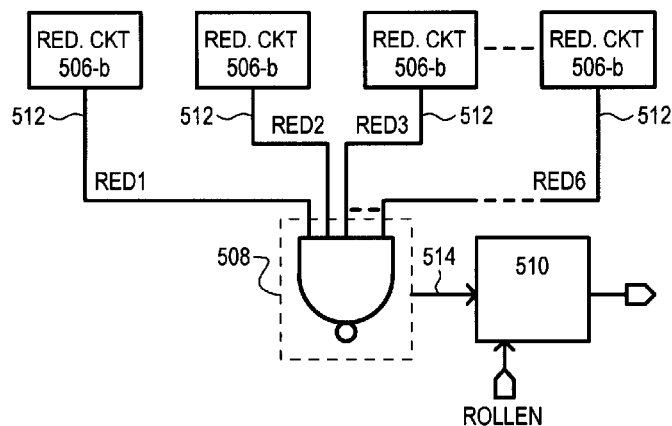
FIG. 6 shows conventional redundancy circuits and a result output circuit.
Figure 7:
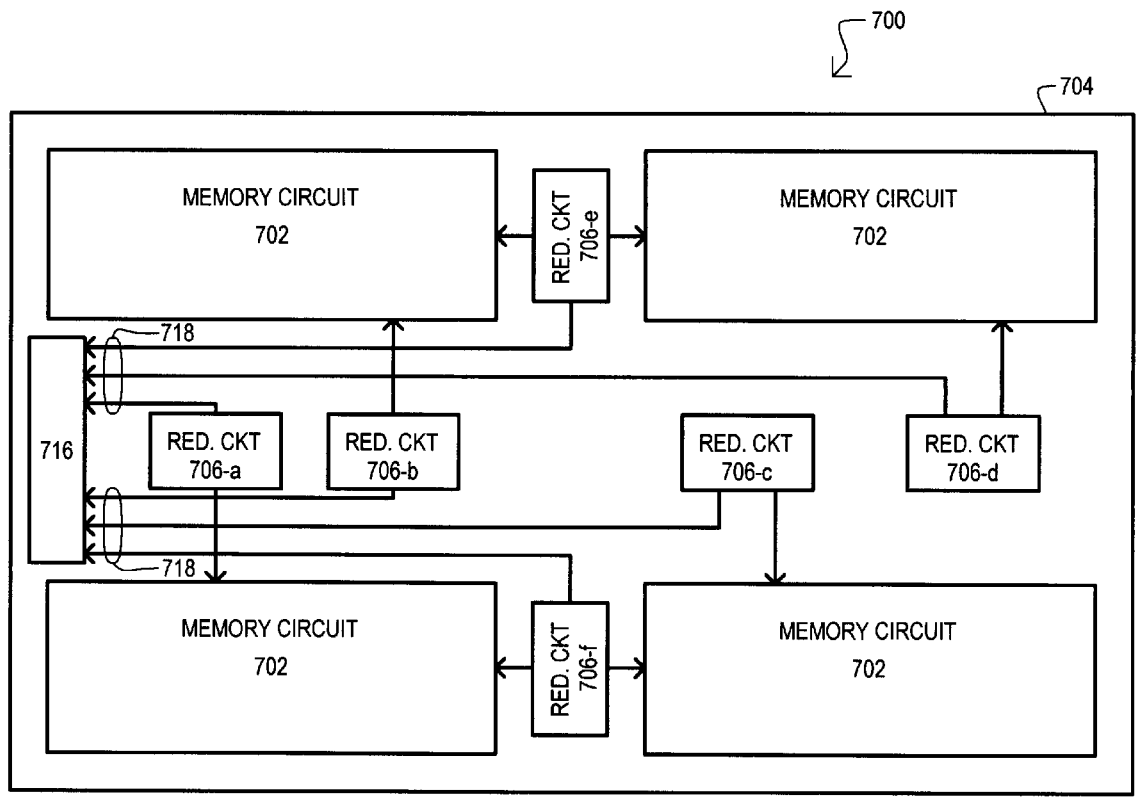
FIG. 7 is a second example of a conventional data memory.

FIG. 4 illustrates one of the many possible variations in a logic circuit. The logic circuit is designated by the general reference character 400 and can include a number of input switching circuits 402-1 to 402-4. Input switching circuits (402-1 to 402-4) in one particular arrangement can include OR gates. Selected input switching circuits 402-1 and 402-2 can receive redundancy signals REDn and REDn-1. In addition, those input switching circuits (402-1 and 402-2) that receive redundancy signals can be commonly enabled by a roll call enable signal ROLLEN (in this case active low). Other input switching circuits (402-3 and 402-4) can receive other input signals, such as test signals (TEST2 and TEST3) aw well as other predetermined enable signals (TEST2EN and TEST3EN) (also active low).

In the logic circuit 400, by activating the roll call enable signal ROLLEN and deactivating other enable signals (TEST2EN and TEST3EN), it is possible to transfer a redundancy signal (REDn or REDn-1) to a decision and output circuit (124 or 202). In this way a roll call operation can be executed.

However, by deactivating the roll call enable signal ROLLEN, while activating one or more other enable signals (TEST2EN and TEST3EN), it can be possible to transfer a test signal (TEST2 and TEST3) to a decision and output circuit (124 or 202). Test results can thus be output on an external connection terminal. In this way various test signals may be transferred up to a decision and output circuit (124 or 202) without unduly increasing the number of signal wirings and/or the number of external connection terminals for providing test results.

The particular number of logic circuits (126-1 to 126-4 and 204-1 to 204-4) should not be construed as limiting to the present invention. As just one example, an embodiment could include a number of redundancy circuits connected to one signal wiring in a wired-OR type fashion. The signal wiring could be connected to a decision and output circuit at one end and to a buffer circuit, such as a logic circuit (126-1 to 126-4 and 204-1 to 204-4) at the other end.

A data memory according the present invention may have a number of advantages over conventional approaches.

A semiconductor memory according to one embodiment can include redundancy circuits with access change circuits. When access change circuits change an access from a normal memory cell to a spare memory cell, a redundancy signal can be generated. A decision and output circuit can detect the redundancy signal and provide the signal on an external connection terminal. In this way it can be possible to determine for specific address data whether an access destination is a normal memory cell or a spare memory cell. A number of redundancy circuits can be connected in series up to the decision and output circuit making it possible to detect the activation of any one of the redundancy circuits. Redundancy signals can be transferred to the decision and output circuit by a number of logic circuits in series. Because each logic circuit can include active devices that buffer a redundancy signal to predetermined potentials, it can be possible to apply an input signal to the decision and output circuit that does not vary according to the distance between a redundancy circuit and the decision and output circuit. This may enable more accurate roll call operations and/or allow for reductions in memory chip size, without introducing substantial layout restrictions and/or requiring a test device with particular timing control circuits.

A semiconductor memory according to another embodiment can include a number of redundancy circuits that generate redundancy signals. A redundancy signal can be transferred to a decision and output circuit through circuits providing an OR-type function. A redundancy signal can be buffered to at least a predetermined potential by output circuits in each OR-type circuit. Thus, an input signal can be provided to the decision and output circuit of at least the predetermined potential. This may allow for more accurate detection of a redundancy signal. Such detection can be independent of the distance between an activated redundancy circuit and the decision and output circuit. Further, such an arrangement can allow for reductions in memory chip size while not necessarily introducing substantial layout restrictions and/or requiring a test device with particular timing control circuits.

Other embodiments can include logic circuits, such as those that provide OR-type functions, that include input switching circuits. Such input switching circuits can enable non-redundancy signals, such as test signals, to be applied to a decision and output circuit. Thus, non-redundancy signals that are buffered and/or of a predetermined potential can be provided to the decision and output circuit. This may allow for accurate detection of non-redundancy signals with a relatively simple structure.

Embodiments that include input switching can include input switches with active devices. Such active devices can buffer input signals allowing a signal of a predetermined potential to be applied to a decision and output circuit.

Embodiments that include logic circuits can include a NAND gate and an inverter. Thus, when redundancy circuits operate according to "negative" logic, such logic circuits can transfer a buffered redundancy signal to a decision and output circuit.

One skilled in the art would recognize that the teachings of the present invention could be utilized in a variety of different data memory types. Among the many possible data memory types are dynamic random access memories (DRAMs), static RAMs (SRAMs), ferroelectric RAMs (FRAMs), magnetoresistive RAMs, read only memories (ROMs), programmable ROMs (PROMs), electrically PROMs (EPROMs), electrically erasable PROMs (EEPROMs), including "flash" EEPROMs. Of course this list is exemplary and not exhaustive.

Along these same lines, one skilled in the art would recognize that while some the embodiments have been described as memory chips, the invention could be incorporated into an integrated memory. An integrated memory can be a memory formed in a larger integrated circuit.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A data memory, comprising:

at least one memory circuit including a plurality of normal memory cells accessed by predetermined addresses and at least one spare memory cell;

a plurality of redundancy circuits, each redundancy circuit providing access to a spare memory cell instead of a normal memory cell when activated, and including a signal generating circuit that generates a redundancy signal when the redundancy circuit is activated;

a decision and output circuit that detects a redundancy signal generated by a signal generating circuit of at least one redundancy circuit, the decision and output circuit providing the redundancy signal on an external connection; and a plurality of logic gates arranged in series, the signal generating circuits of the redundancy circuits being successively coupled to the decision and output circuit by the series of logic gates, each logic gate including an active element that buffers a received redundancy signal to at least a predetermined potential.

2. The data memory of claim 1, wherein:

the at least one memory circuit further includes a memory access circuit that accesses normal memory cells according to an applied address.

3. The data memory of claim 1, wherein:

each redundancy circuit includes an address setting circuit that can set a predetermined address of a normal memory cell to an address of a spare memory cell.

4. The data memory of claim 3, wherein:

each redundancy circuit includes an access change circuit that changes a data memory access from an access to a normal memory cell to an access of a spare memory cell when an applied address coincides with an address set in the address setting circuit.

5. The data memory of claim 4, wherein:

the signal generating circuit generates the redundancy signal when the access change circuit is activated.

6. The data memory of claim 1, wherein:

each logic circuit provides an OR-like function.

7. The data memory of claim 1, wherein:

each logic circuit includes a logic gate having at least one input coupled to a signal generating circuit.

8. The data memory of claim 1, further including:

at least one input switching circuit for selectively inputting signals into at least one logic circuit; and at least one redundancy circuit is coupled to a logic gate by the at least one input switching circuit.

9. The data memory of claim 8, wherein:

the at least one input switching circuit includes an active device that buffers a selected input signal to at least a predetermined potential.

10. The data memory of claim 1, wherein:

each logic circuit includes a NAND gate and an inverter.

11. A data memory, comprising:

at least one memory circuit including a plurality of normal memory cells and at least one spare memory cell;

a plurality of redundancy circuits, each redundancy circuit providing access to a spare memory cell instead of a normal memory cell when activated, and including a signal generating circuit that generates a redundancy signal when the redundancy circuit is activated;

a decision and output circuit that detects a redundancy signal generated by a signal generating circuit of at least one redundancy circuit; and a plurality of logic gates arranged in series, the signal generating circuits of the redundancy circuits being successively coupled to the decision and output circuit by the series of logic gates, each logic gate including an output circuit that buffers a received redundancy signal to at least a predetermined potential.

12. A data memory, comprising:

at least one memory circuit having a plurality of normal memory cells and at least one spare memory cell;

a plurality of redundancy circuits, each redundancy circuit receiving address information and generating a redundancy signal when the address information corresponds to stored defective address information;

a decision and output circuit that receives at least a redundancy input signal and provides an output signal;

a plurality of logic circuits that transmit redundancy signals from the redundancy circuits to the decision and output circuit as a redundancy input signal, at least one logic circuit buffering a redundancy signal to at least a predetermined potential.

13. The data memory of claim 12, wherein:

the data memory includes a first end and an opposing second end;

the decision and output circuit is situated proximate to the first end; and the logic circuits are arranged in series between the decision and output circuit and the second end.

14. The data memory of claim 13, wherein:

the logic circuit closest to the second end buffers a redundancy signal to at least the predetermined potential.

15. The data memory of claim 12, wherein:

the logic circuits are arranged in series, each logic circuit receiving a redundancy signal and logically combining the received redundancy signal with the output of a previous logic circuit in the series.

16. The data memory of claim 12, wherein:

the at least one memory circuit includes rows and columns of normal memory cells; and the redundancy circuits include at least one row redundancy circuit that receive row address information and generates a redundancy signal when the row address information corresponds to stored defective row address information, and at least one column redundancy circuit that receives column address information and generates a redundancy signal when the column address information corresponds to stored defective column address information.

17. The data memory of claim 12, wherein:

each redundancy circuit includes a redundancy information circuit having an address comparison circuit that compares received address data with stored address data and generates a redundancy signal, the redundancy signal being coupled to at one least logic circuit and to the normal memory cells of at least one memory circuit.

18. The data memory of claim 17, wherein:

the redundancy information circuit further includes a ROM that can store defective address information.

19. The data memory of claim 12, wherein:

at least one logic circuit includes a plurality of input switching circuits, each input switching circuit coupling an input signal to the at least one logic circuit according to at least one select signal, at least one input signal being a redundancy signal.

20. The data memory of claim 19, wherein:

the at least one input signal further includes a test signal and the at least one select signal includes a redundancy enable signal and a test enable signal, the input switching circuits coupling the redundancy signal to the logic circuit when the redundancy enable signal is active and coupling the test signal to the logic circuit when the test enable signal is active.

* * * * *